(12) United States Patent
Lin et al.

(10) Patent No.: US 8,013,434 B2
(45) Date of Patent: Sep. 6, 2011

(54) THIN DOUBLE-SIDED PACKAGE SUBSTRATE AND MANUFACTURE METHOD THEREOF

(75) Inventors: Chi Chih Lin, Pingihen (TW); Bo Sun, Pingihen (TW); Hung Jen Wang, Gueishan Township (TW); Jen Feng Tseng, Jhongli (TW)

(73) Assignee: Light Ocean Technology Corp., Taoyuan County (TW)

( * ) Notice: Subject to any disclaimer, the term of this patent is extended or adjusted under 35 U.S.C. 154(b) by 571 days.

(21) Appl. No.: 12/128,163

(22) Filed: May 28, 2008

(65) Prior Publication Data
US 2008/0315239 A1    Dec. 25, 2008

(30) Foreign Application Priority Data
Jun. 22, 2007 (TW) .................................. 96122537

(51) Int. Cl.
*H01L 33/00* (2010.01)
(52) U.S. Cl. .................. 257/698; 257/99; 257/E23.011; 257/E33.058
(58) Field of Classification Search .................. 257/99, 257/698, E23.011, E33.058
See application file for complete search history.

(56) References Cited

U.S. PATENT DOCUMENTS 5,081,563 A * 1/1992 Feng et al. ..................... 361/795
6,034,712 A * 3/2000 Iwasaki ......................... 347/241

* cited by examiner

*Primary Examiner* — Benjamin Sandvik
*Assistant Examiner* — Krista Soderholm
(74) *Attorney, Agent, or Firm* — Rosenberg, Klein & Lee

(57) ABSTRACT

The present invention discloses a package substrate comprising an insulative carrier having a through-hole penetrating the top and bottom surfaces thereof; at least one first and second conductive layers comprising circuits respectively formed on the top and bottom surfaces and covering an opening of the through-hole; a conductive element set in the through-hole for electrically connecting the first and second conductive layers; a first metal layer formed on the first and/or the second conductive layer; and at least one chip receiving bay formed by removing a portion of the carrier from the upper to the lower surfaces until the second conductive layer is exposed for accommodating at least one chip therein on the exposed second conductive layer. The package structure has a reduced overall thickness and an enhanced heat-dissipation effect for the chip and prevents from humidity penetration. A manufacturing method for the package structure is also disclosed.

10 Claims, 5 Drawing Sheets

THIN DOUBLE-SIDED PACKAGE SUBSTRATE AND MANUFACTURE METHOD THEREOF

BACKGROUND OF THE INVENTION

1. Field of the Invention

The present invention relates to a package substrate and a manufacture method thereof, particularly to a thin double-sided package substrate and a manufacture method thereof 2. Description of the Related Art Refer to FIG. 1. In a conventional package substrate having circuits on both sides thereof, conductive layers 12 and 13 are respectively formed on the upper and lower surfaces of a carrier 11, and the desired circuits are formed on the conductive layers 12 and 13. A through-hole 14 penetrates the carrier 11, and a conductive element 15 is set inside the through-hole 14 to electrically connect the conductive layer 12 with the conductive layer 13. Besides, an insulating material, such as a resin or a solder mask, may further be filled into the through-hole 14. A metal finishing process is used to form a solder pad 17. A solder mask layer 16 is formed on the conductive layers 12 and 13 with the solder pad 17 exposed.

As shown in FIG. 1, a chip 21 is fixedly installed on the package substrate, and wires 22 electrically connect the chip 21 with package substrate. Then, an encapsulant 23 is used to encapsulate the chip 21, the wires 22, etc., to complete the package of a chip. However, the abovementioned package structure has the following disadvantages: 1. The solder mask layer 16, the conductive layers 12 and 13, and carrier 11 are likely to peel off because of the poor bonding therebetween; 2. Humidity is likely to permeate from the non-encapsulated lower surface of the carrier 11 through the inner wall of the through-hole 14 to the upper surface of the carrier 11 because the through-hole 14 penetrates the carrier 11 and the conductive layers 12 and 13, and the reliability of the circuit is thus reduced. Besides, the chip 21 is fixedly installed on the package substrate which not only makes worse the heat dissipation of the chip 21 but also impairs the slimming of the chip package.

Therefore, how to promote reliability, reduce thickness, enhance heat dissipation and increase layout flexibility in a chip package has become an important topic in the fields concerned.

SUMMARY OF THE INVENTION

One objective of the present invention is to provide a thin double-sided package substrate and a manufacture method thereof to overcome the abovementioned problems, wherein the carrier is partially or totally removed to form a chip receiving bay accommodating a chip so as to reduce the package thickness and enhance the heat dissipation of the chip, and wherein the through-hole does not penetrate the lower conductive layer lest humidity permeate through the inner wall of the through-hole to the upper surface of the carrier, whereby the reliability of the chip package is promoted and the flexibility of the circuit layout is increased.

To achieve the abovementioned objective, one embodiment of the present invention proposes a thin double-sided package substrate, which includes: a carrier, at least one first conductive layer, at least one second conductive layer, a conductive element, a first metal layer and at least one chip receiving bay. The carrier has a first surface, a second surface and a through-hole, wherein the through-hole penetrates the first and second surfaces, and the carrier is made of an insulating material. The first conductive layer is formed on the first surface, and the second conductive layer is formed on the second surface, wherein the second conductive layer covers one opening of the through-hole, and the first conductive layer and/or the second conductive layer comprise circuits. The conductive element is set in the through-hole and electrically connects the first conductive layer with the second conductive layer. The first metal layer is formed on the first conductive layer and/or the second conductive layer. The chip receiving bay is formed by removing a portion of the carrier from the first surface to the second surface until the second conductive layer thereunder is exposed for accommodating at least one chip therein on the exposed second conductive layer.

To achieve the abovementioned objective, one embodiment of the present invention proposes a manufacture method for a thin double-sided package substrate, which includes: providing a carrier having a first surface and a second surface, wherein the carrier is made of an insulating material; forming a first conductive layer on the first surface; forming a second conductive layer on the second surface; forming a through-hole penetrating the first conductive layer and the carrier but not penetrating the second conductive layer; setting in the through-hole a conductive element electrically connecting the first conductive layer with the second conductive layer; forming desired circuits in the first conductive layer and/or the second conductive layer; forming a first metal layer in the first conductive layer and/or the second conductive layer; and removing a portion of the carrier in a predetermined region from the first surface to the second surface until the second conductive layer thereunder is exposed to form at least one chip receiving bay for accommodating at least one chip therein on the exposed second conductive layer.

Below, the embodiments are described in detail in cooperation with the attached drawings to make easily understood the objectives, technical contents, characteristics and accomplishments of the present invention.

DETAILED DESCRIPTION OF THE INVENTION

Figure 1:
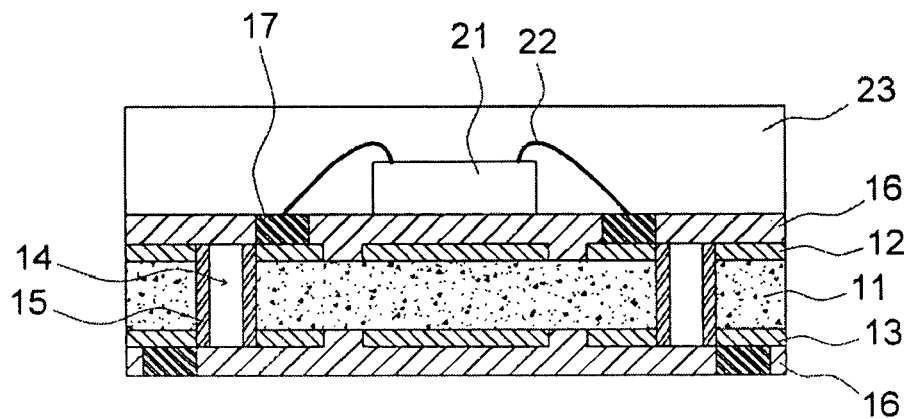
FIG. 1 is a sectional view schematically showing a chip package structure using a conventional package substrate.
Figure 2A:
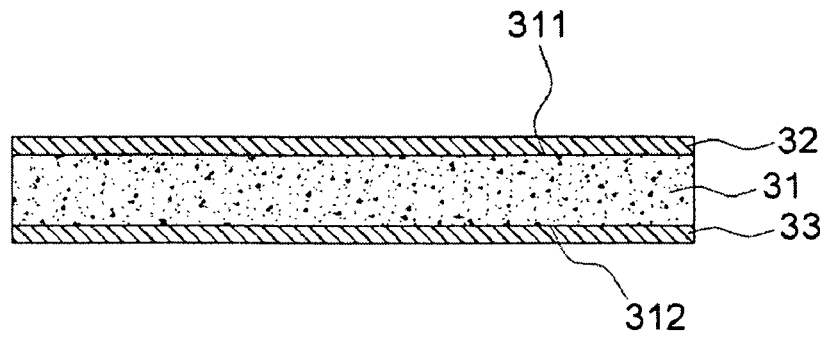
FIGS. 2a-2f are sectional views schematically showing the process of a manufacture method for a thin double-sided package substrate according to a preferred embodiment of the present invention.

Refer to from FIG. 2a to FIG. 2f for illustrating the process of a manufacture method for a thin double-sided package substrate according to a preferred embodiment of the present invention. Refer to FIG. 2a. Firstly, a carrier 31 having a first surface 311 and a second surface 312 is provided. The carrier 31 may be made of a copper clad laminate, an insulating material, a glass fiber prepreg, or a polymeric material etc. A first conductive layer 32 and a second conductive layer 33 are respectively formed on the first surface 311 and the second surface 312. The first and second conductive layers 32 and 33 may be made of a metal, preferably copper.

Figure 2B:
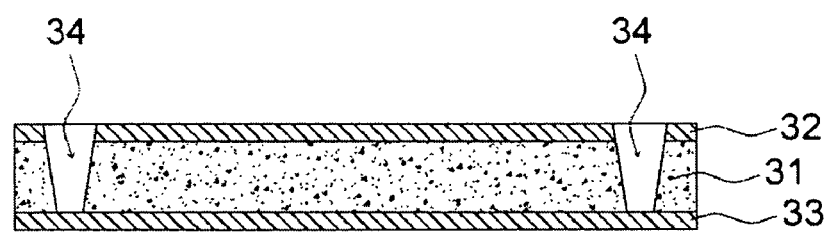

Refer to FIG. 2b. A through-hole 34 penetrates the first conductive layer 32, the first and second surfaces 311 and 312 of the carrier 31. It is to be noted that the through-hole 34 does not penetrate the second conductive layer 33. Therefore, humidity will not permeate through the inner wall of the through-hole 34 to the upper layer of the carrier 31 but will be blocked by the second conductive layer 33. The through-hole 34 is fabricated with an appropriate method, such as a plasma method, a laser-drilling method, a depth-control method, or a photolithographic method.

Figure 2C:
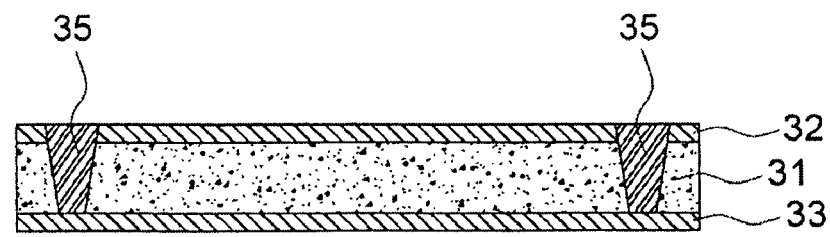

Refer to FIG. 2c. A conductive element 35 is set in the through-hole 34 to electrically connect the first conductive layer 32 with the second conductive layer 33. For example, the conductive element 35 is formed with a copper electroplating method, a metal electroplating method, or an electrodeless plating method. Alternatively, the conductive element 35 can be formed via filling a conductive glue into the through-hole 34.

Figure 2D:
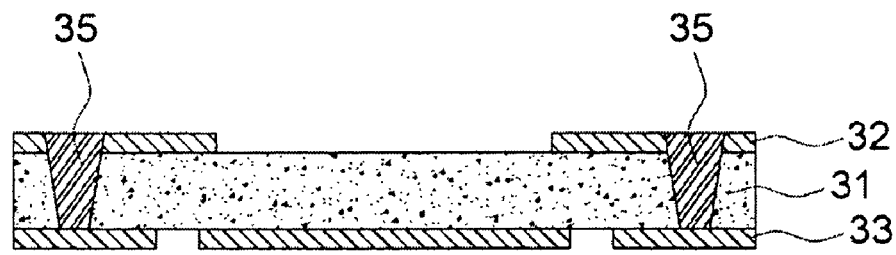

Refer to FIG. 2d. The first conductive layer 32 and/or the second conductive layer are partially removed to form the desired circuits. It is to be noted that the first conductive layer 32 and/or the second conductive layer 33 is not limit to have a single layer of circuits but may have multiple layers of circuits. For example, if the first conductive layer 32 contains a plurality of layers of circuits, the through-hole 34 only needs to penetrate one layer of circuits thereof, which is sufficient to electrically connect the first conductive layer 32 with the second conductive layer 33.

Figure 2E:
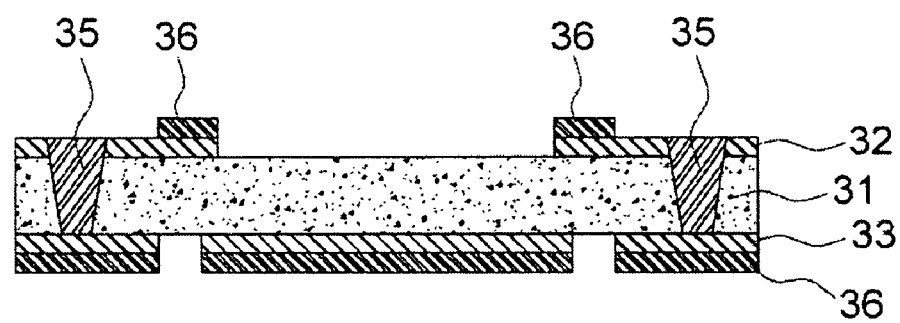

Refer to FIG. 2e. A first metal layer 36 is formed on the first conductive layer 32 and/or the second conductive layer 33. For example, the first metal layer 36 may be fabricated into a solder pad where a wire is soldered to electrically connect a chip and the package substrate. The first metal layer 36 may be fabricated with a metal finishing process. It is to be noted that the metal finishing process can simultaneously process the circuits fabricated from the first and second conductive layers 32 and 33. Besides, the metal finishing process can also only process the selected areas with an appropriate method, such as an image-transfer method. The first metal layer 36 may be made of gold, nickel, palladium, tin, silver, or a combination of the abovementioned metals.

Figure 2F:
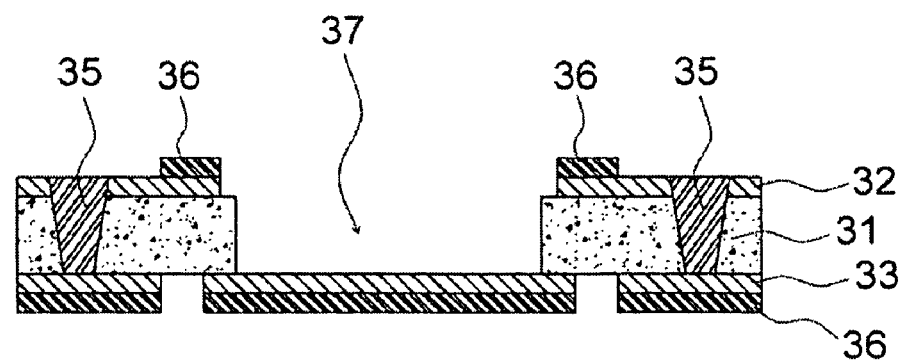

Refer to FIG. 2f. The carrier 31 located in a predetermined region is removed to form a chip receiving bay 37 for accommodating a chip. Thus is completed a thin double-sided package substrate according to one embodiment of the present invention. The chip receiving bay 37 is fabricated with an appropriate method, such as a plasma method, a laser method, a depth-control method, an image-transfer method, or a mechanical method. It is to be noted that the extent by which the carrier 31 is removed determines the depth of the chip receiving bay 37. In the package substrate shown in FIG. 2f, the carrier 31 located in the predetermined region is completely removed, and the bottom of the chip receiving bay 37 is exactly the second conductive layer 33. In other words, the chip receiving bay 37 has the maximum depth.

Refer to FIG. 2f again. According to the present invention, a preferred embodiment proposes a thin double-sided package substrate including: a carrier 31, at least one first conductive layer 32, at least one second conductive layer 33, a conductive element 35, a first metal layer 36, and a chip receiving bay 37. The carrier 31 has a first surface 311, a second surface 312 and a through-hole 34, and the through-hole 34 penetrates the first and second surfaces 311 and 312. The first and second conductive layers 32 and 33 are respectively formed on the first and second surfaces 311 and 312 of the carrier 31, and the second conductive layer 33 covers one opening of the through-hole 34. In this embodiment, the second conductive layer 33 covers the opening of the through-hole 34 on the second surface 312 of the carrier 31. The conductive element 35 is set in the through-hole 34 to electrically connect the first conductive layer 32 and the second conductive layer 33. The first metal layer 36 is formed on the first conductive layer 32 and/or the second conductive layer 33. The chip receiving bay 37 is formed in the carrier 31 to accommodate a chip.

Figure 3A:
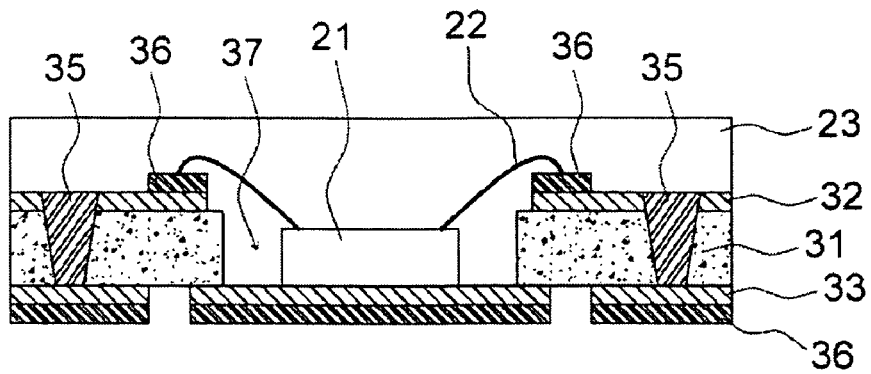
FIGS. 3a-3c are sectional views schematically showing that the chip package structures using the thin double-sided package substrates according to embodiments of the present invention.

Refer to FIGS. 3a-3c and FIGS. 4a-4c diagrams schematically showing that the embodiments of the thin double-sided package substrate of the present invention are applied to chip packaging. The package structure in FIG. 3a adopts the thin double-sided package substrate shown in FIG. 2f. As shown in FIG. 3a, the bottom of the chip receiving bay 37 is exactly the second conductive layer 33, and the chip 21 is fixedly installed on the second conductive layer 33. A wire 22 extending from the chip 21 is soldered to the first metal layer 36 to electrically connect the chip 21 and the package substrate. Then, an encapsulant 23 is used to encapsulate the chip 21 and the wire 22. As the chip 21 is fixedly installed on the second conductive layer 33, the heat generated by the chip 21 can be dissipated via the second conductive layer 33, and heat dissipation is thus improved. Further, as the chip 21 is accommodated in the chip receiving bay 37, the overall thickness of the package structure is reduced, and the objective of slimming the package structure is thus achieved.

Figure 3B:
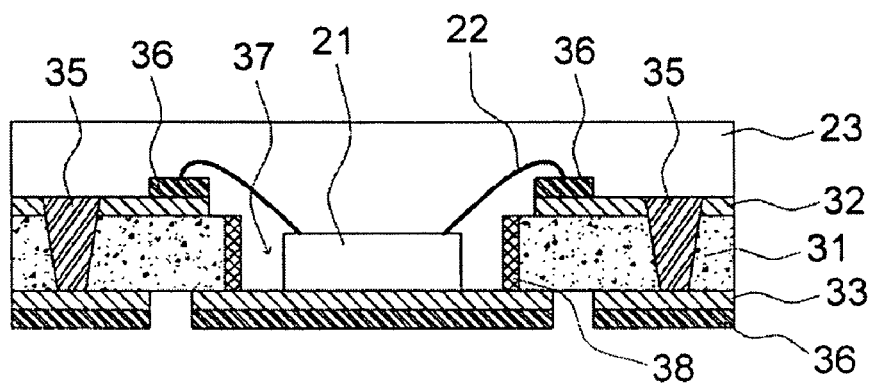
Figure 3C:
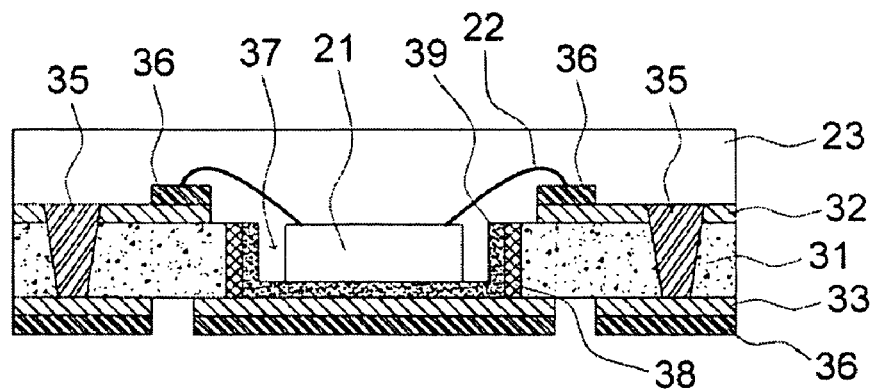

Refer to FIG. 3b. If the chip is a light emitting diode, a second metal layer 38, such as an electroplated copper layer, is formed inside the chip receiving bay 37 to function as a reflective layer of the light emitting diode, and it is preferable to further form a third metal layer 39 on the second metal layer 38 with a metal finishing method to enhance the reflection effect, as shown in FIG. 3c. For example, the third metal layer 39 may be made of gold, nickel, palladium, tin, silver, or a combination of the abovementioned metals.

Figure 4A:
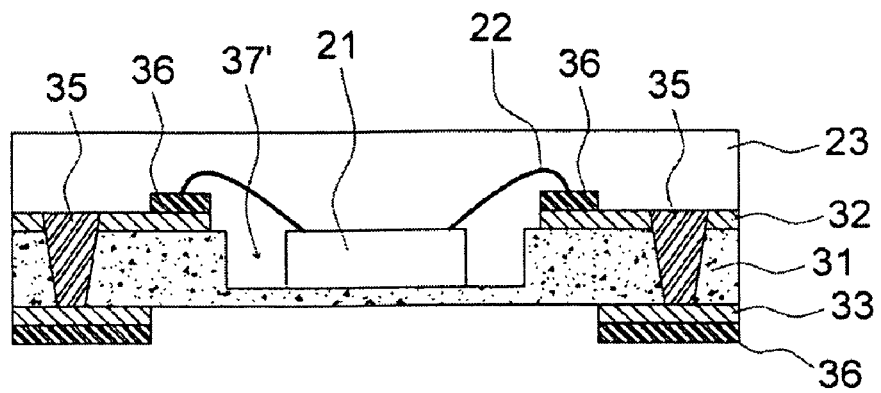
FIGS. 4a-4c are sectional views schematically showing the chip package structures using the thin double-sided package substrates according to other embodiments of the present invention.
Figure 4B:
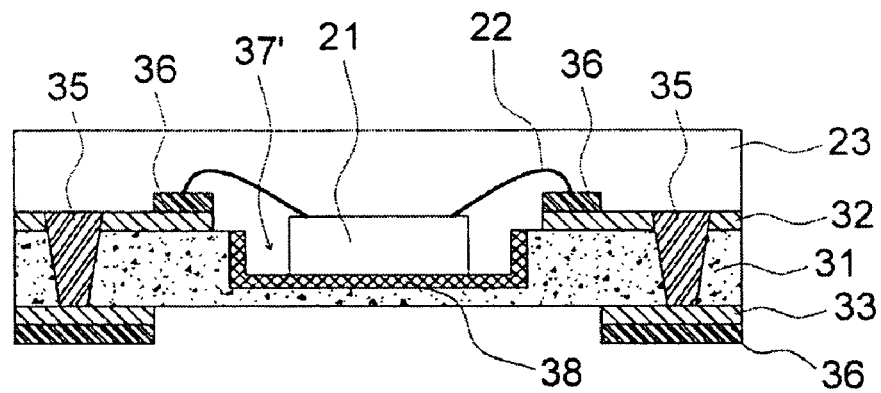
Figure 4C:
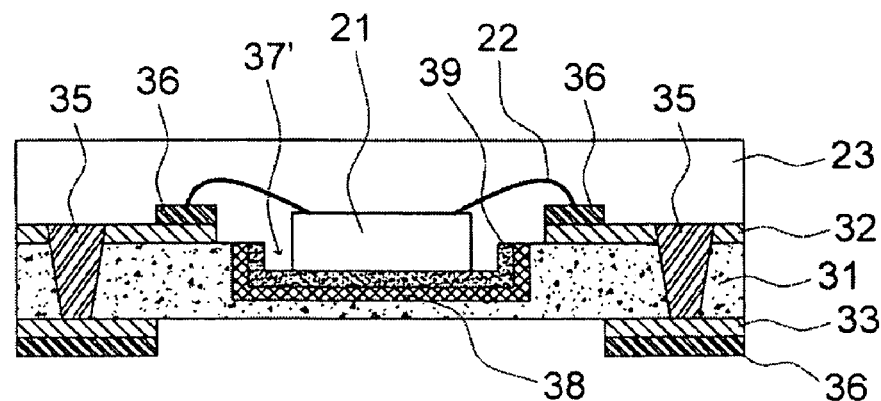

Refer to FIG. 4a. If the chip receiving bay 37' does not penetrate the carriers 31 (i.e. the carrier 31 located in the predetermined region is not thoroughly removed), the bottom of the chip receiving bay 37' is still formed of the carrier 31, and the chip 21 is fixedly installed on the carrier 31. Thus, the second conductive layer 33 exactly below the chip receiving bay 37' is not indispensable. Compared with the conventional technologies, the carrier 31 below the chip 21 has a smaller thickness, and the chip 21 can thus be heat-dissipated more efficiently. Refer to FIGS. 4c-4c. In this embodiment, a second metal layer 38 and a third metal layer 39 may be formed to function as the reflective layers of a light emitting diode to improve the total light efficiency.

The abovementioned embodiments that the carrier has one chip receiving bay accommodating one chip are only used to exemplify the present invention but not to limit the present invention. In the present invention, the carrier may have more than one chip receiving bay, and each chip receiving bay may accommodate at least one chip.

In conclusion, the present invention proposes a thin double-sided package substrate and a manufacture method thereof, wherein a chip receiving bay is formed in a package substrate for accommodating a chip, whereby the package thickness is reduced, and package slimming is achieved. Further, in the present invention, the carrier below the chip has a smaller thickness, or the chip is fixedly installed on a metallic conductive layer; therefore, the present invention has a better heat-dissipation efficiency. Besides, in the present invention, the through-hole used to electrically connect the upper and lower conductive layers does not penetrate the lower conductive layer, whereby humidity is hard to permeate through the inner wall of the through-hole to the upper layer of the carrier, and the reliability of the package structure is promoted.

The embodiments described above are to exemplify the present invention to enable the persons skilled in the art to understand, make and use the present invention. However, it is not intended to limit the scope of the present invention. Therefore, any equivalent modification or variation according to the spirit of the present invention is to be also included within the scope of the present invention.

What is claimed is:

1. A thin double-sided package substrate, comprising:
   a carrier having a first surface, a second surface and a through-hole, wherein the through-hole penetrates the first surface and the second surface, and the carrier is made of insulating material;
   at least one first conductive layer formed on the first surface;
   at least one second conductive layer formed on the second surface and covering an opening of the through-hole, wherein the first conductive layer and/or the second conductive layer comprise circuits;
   a conductive element set in the through-hole and used to electrically connect the first conductive layer with the second conductive layer;
   a first metal layer formed on the first conductive layer and/or the second conductive layer; and
   at least one chip receiving bay formed by removing a portion of the carrier from the first surface to the second surface until the second conductive layer thereunder is exposed for accommodating at least one chip therein on the exposed second conductive layer.

2. The thin double-sided package substrate according to claim 1, wherein the through-hole penetrates the first conductive layer.

3. The thin double-sided package substrate according to claim 1, wherein the first conductive layer contains a plurality of layers of circuits, and the through-hole penetrates at least one layer of the circuits.

4. The thin double-sided package substrate according to claim 1, wherein the carrier is made of a glass fiber prepreg, or a polymeric material.

5. The thin double-sided package substrate according to claim 1, wherein the first conductive layer and the second conductive layer are made of a metal or a copper.

6. The thin double-sided package substrate according to claim 1, wherein the conductive element is made of copper, a metal or a conductive glue.

7. The thin double-sided package substrate according to claim 1, wherein the first metal layer is made of gold, nickel, palladium, tin, silver or a combination thereof.

8. The thin double-sided package substrate according to claim 1 further comprising a second metal layer formed on inner walls of the chip receiving bay.

9. The thin double-sided package substrate according to claim 8 further comprising a third metal layer, which is formed on the second metal layer and is made of gold, nickel, palladium, tin, silver or a combination thereof.

10. The thin double-sided package substrate according to claim 1, wherein the chip is a light emitting diode.

* * * * *